(12) United States Patent
Lin et al.

(10) Patent No.: US 11,956,973 B2
(45) Date of Patent: Apr. 9, 2024

(54) MAGNETORESISTIVE RANDOM ACCESS MEMORY AND METHOD FOR FABRICATING THE SAME

(71) Applicant: UNITED MICROELECTRONICS CORP., Hsin-Chu (TW)

(72) Inventors: Hung-Chan Lin, Tainan (TW); Yu-Ping Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 337 days.

(21) Appl. No.: 17/369,917

(22) Filed: Jul. 7, 2021

(65) Prior Publication Data
US 2022/0392955 A1 Dec. 8, 2022

(30) Foreign Application Priority Data
Jun. 2, 2021 (CN) .......................... 202110613576.5

(51) Int. Cl.
*H10B 61/00* (2023.01)
*H10N 50/01* (2023.01)
*H10N 50/80* (2023.01)

(52) U.S. Cl.
CPC ............. *H10B 61/22* (2023.02); *H10N 50/01* (2023.02); *H10N 50/80* (2023.02)

(58) Field of Classification Search
CPC ......... H10B 61/22; H10N 50/80; H10N 50/01
USPC ........................................................ 257/421
See application file for complete search history.

(56) References Cited

U.S. PATENT DOCUMENTS

| 9,230,626 | B2 | 1/2016 | Buhrman et al. | |
| 9,824,735 | B1* | 11/2017 | Kan | G11C 11/1695 |
| 2017/0148978 | A1* | 5/2017 | Apalkov | G11C 11/161 |
| 2019/0312198 | A1* | 10/2019 | Sun | H10N 50/10 |
| 2020/0006626 | A1* | 1/2020 | Smith | H10B 61/22 |
| 2021/0143323 | A1* | 5/2021 | Kim | H10N 50/01 |
| 2022/0285609 | A1* | 9/2022 | Huang | H10N 52/01 |
| 2023/0255122 | A1* | 8/2023 | Chen | H10N 52/01 |
| | | | | 257/241 |

* cited by examiner

*Primary Examiner* — Jami Valentine Miller
(74) *Attorney, Agent, or Firm* — Winston Hsu

(57) ABSTRACT

A method for fabricating a semiconductor device includes the steps of: forming a magnetic tunneling junction (MTJ) on a substrate; forming a first spin orbit torque (SOT) layer on the MTJ; forming a passivation layer around the MTJ; forming a second SOT layer on the first SOT layer and the passivation layer; and patterning the second SOT layer and the passivation layer.

8 Claims, 5 Drawing Sheets

MAGNETORESISTIVE RANDOM ACCESS MEMORY AND METHOD FOR FABRICATING THE SAME

BACKGROUND OF THE INVENTION

1. Field of the Invention

The invention relates to a method for fabricating semiconductor device, and more particularly to a method for fabricating magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of: forming a magnetic tunneling junction (MTJ) on a substrate; forming a first spin orbit torque (SOT) layer on the MTJ; forming a passivation layer around the MTJ; forming a second SOT layer on the first SOT layer and the passivation layer; and patterning the second SOT layer and the passivation layer.

According to another aspect of the present invention, a semiconductor device includes a magnetic tunneling junction (MTJ) on a substrate, a first spin orbit torque (SOT) layer on the MTJ, a passivation layer around the MTJ, and a second SOT layer on the first SOT layer and the passivation layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
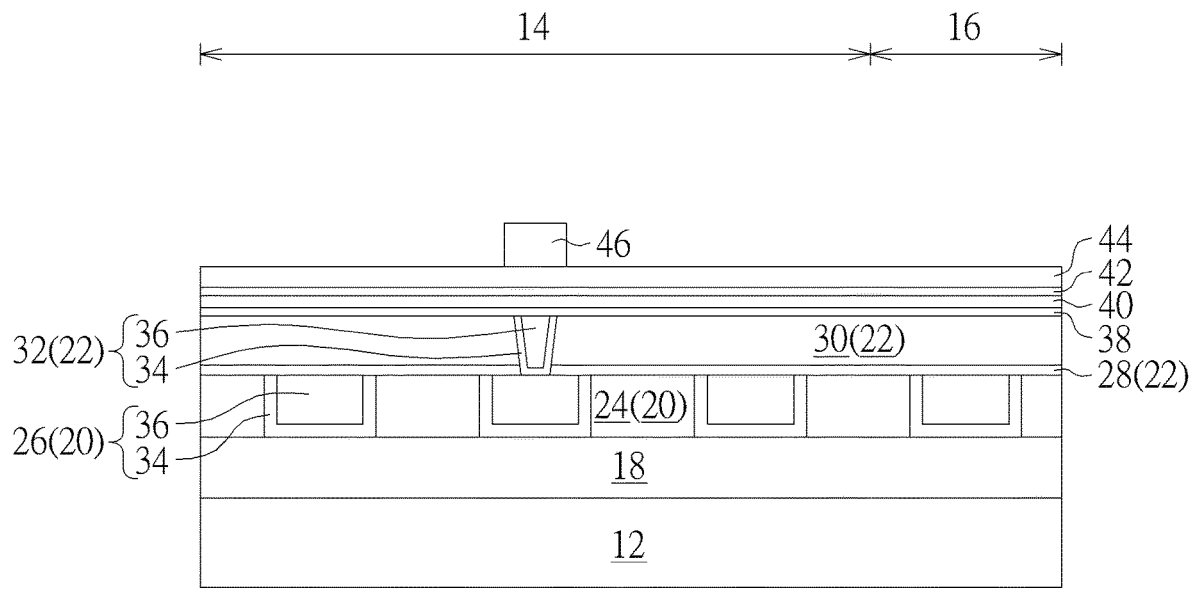
FIGS. 1-10 illustrate a method for fabricating a MRAM device according to an embodiment of the present invention.

Referring to FIGS. 1-10 FIGS. 1-10 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 26 are preferably made of copper, the metal layer 36 in the metal interconnections 32 are made of tungsten, the IMD layers 24, 30 are preferably made of silicon oxide such as tetraethyl orthosilicate (TEOS), and the stop layer 28 is preferably made of nitrogen doped carbide (NDC), silicon nitride, silicon carbon nitride (SiCN), or combination thereof.

Next, a bottom electrode 38, a MTJ stack 40 or stack structure, a top electrode 42, a first spin orbit torque (SOT) layer 44, and a patterned mask 46 are formed on the metal interconnect structure 22. In this embodiment, the formation of the MTJ stack 40 could be accomplished by sequentially depositing a pinned layer, a barrier layer, and a free layer on the bottom electrode 38. In this embodiment, the bottom electrode layer 38 and the top electrode layer 42 are preferably made of conductive material including but not limited to for example Ta, Pt, Cu, Au, Al, or combination thereof. The pinned layer could be made of ferromagnetic material including but not limited to for example iron, cobalt, nickel, or alloys thereof such as cobalt-iron-boron (CoFeB) or cobalt-iron (CoFe). Alternatively, the pinned layer could also be made of antiferromagnetic (AFM) material including but not limited to for example ferromanganese (FeMn), platinum manganese (PtMn), iridium manganese (IrMn), nickel oxide (NiO), or combination thereof, in which the pinned layer is formed to fix or limit the direction of magnetic moment of adjacent layers. The barrier layer could be made of insulating material including but not limited to for example oxides such as aluminum oxide ($AlO_x$) or magnesium oxide (MgO). The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field. Preferably, the first SOT layer 44 is serving as a channel for the MRAM device as the first SOT layer 44 could include metals such as tantalum (Ta), tungsten (W), platinum (Pt), or hafnium (Hf) and/or topological insulator such as bismuth selenide ($Bi_xSe_{1-x}$). The patterned mask 46 could include conductive or dielectric material including but not limited to for example TiN.

Figure 2:
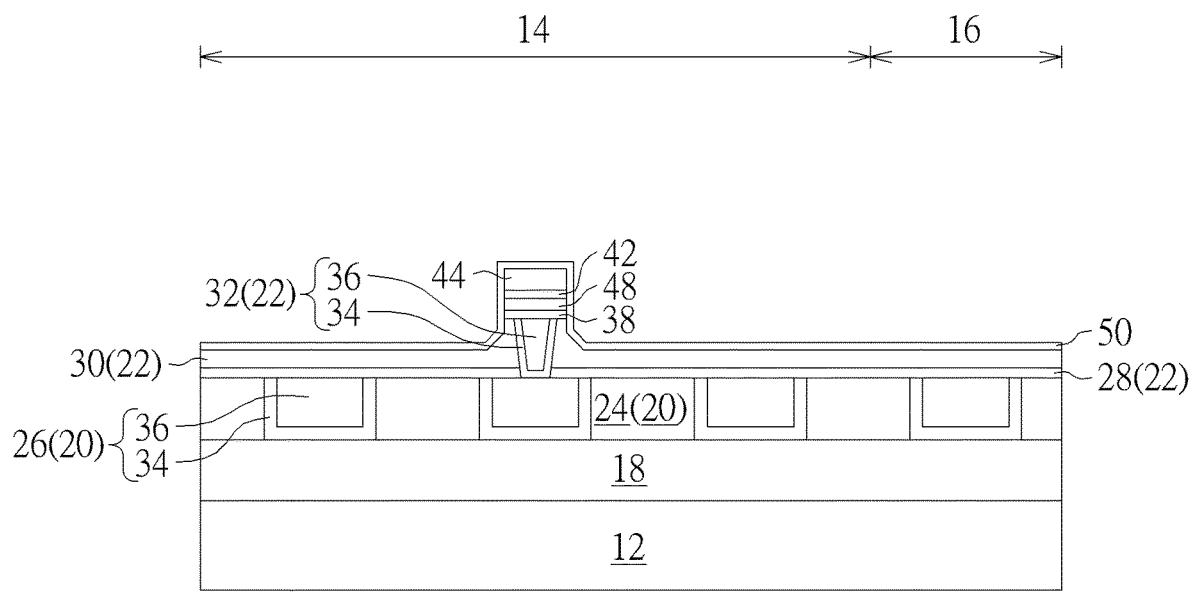

Next, as shown in FIGS. 1-2, one or more etching processes could be conducted by using the patterned mask 46 as mask to remove part of the first SOT layer 44, part of the top electrode 42, part of the MTJ stack 40, part of the bottom electrode 38, and part of the IMD layer 30 to form a MTJ 48 on the MRAM region 14, and the patterned mask 46 is removed thereafter. It should be noted that a reactive ion etching (RIE) and/or an ion beam etching (IBE) process is conducted to remove the top electrode 42, MTJ stack 40, bottom electrode 38, and the IMD layer 30 in this embodiment for forming the MTJ 48. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 is removed at the same time to form inclined sidewalls on the surface of the metal interconnection 32 immediately adjacent to the MTJ 52.

Next, a cap layer 50 is formed on the MTJ 48 while covering the surface of the IMD layer 30. In this embodiment, the cap layer 50 preferably includes silicon nitride, but could also include other dielectric material including but not limited to for example silicon oxide, silicon oxynitride (SiON), or silicon carbon nitride (SiCN).

Figure 3:
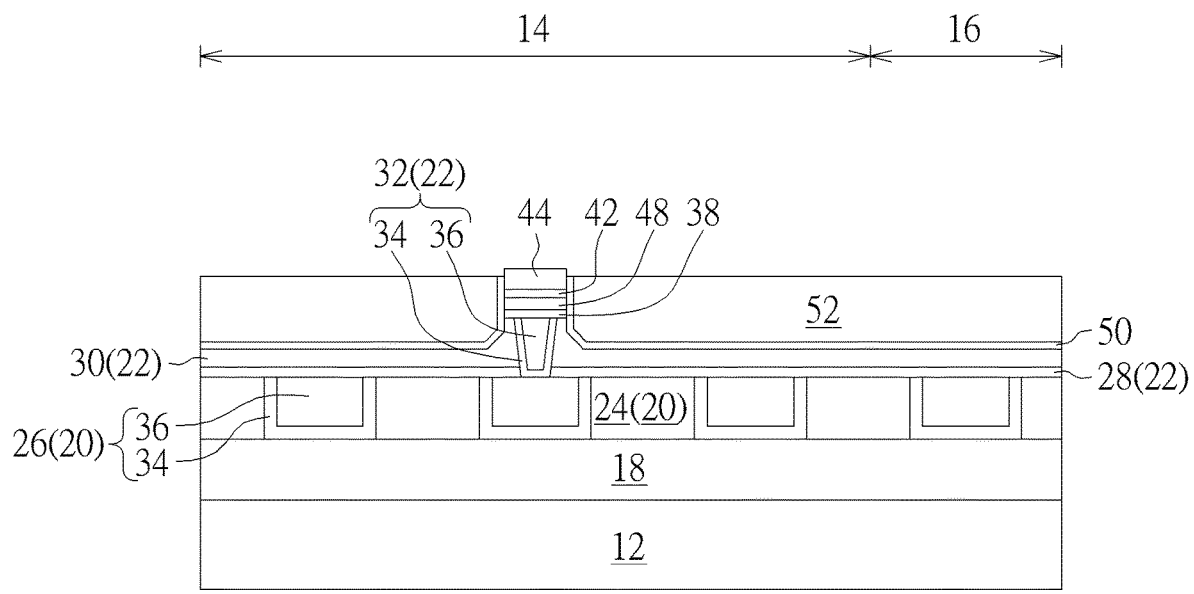

Next, as shown in FIG. 3, an atomic layer deposition (ALD) process is conducted with an etching back process to form a passivation layer 52 around the MTJ 48 and on the IMD layer 30 on logic region 16. In this embodiment, the passivation layer 52 preferably includes silicon oxide, but not limited thereto. It should be noted that after the etching back process is conducted to remove part of the passivation layer 52 and part of the cap layer 50, the top surface of the remaining passivation layer 52 is even with the top surface of the cap layer 50 but slightly lower than the top surface of the first SOT layer 44 so that the first SOT layer 44 slightly protrudes above the passivation layer 52.

Figure 4:
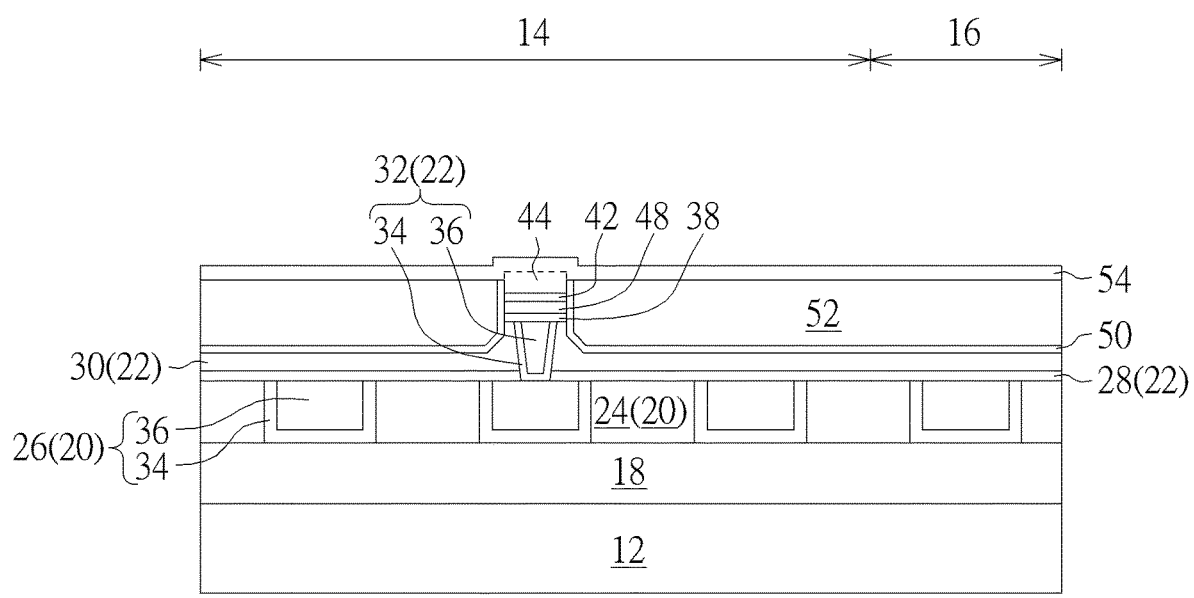

Next, as shown in FIG. 4, a second SOT layer 54 is formed on the surface of the first SOT layer 44 and the passivation layer 52. In this embodiment, the first SOT layer 44 and the second SOT layer 54 are preferably made of same material, in which the second SOT layer 54 also serves as the channel for MRAM device and the second SOT layer 54 could include metals such as tantalum (Ta), tungsten (W), platinum (Pt), or hafnium (Hf) and/or topological insulator such as bismuth selenide ($Bi_xSe_{1-x}$). It should be noted that the second SOT layer 54 is conformally formed on the surfaces of the first SOT layer 44 and the passivation layer 52 so that the top surface of the second SOT layer 54 on top of the passivation layer 52 is slightly lower than the top surface of the second SOT layer 54 on top of the first SOT layer 44.

Figure 5:
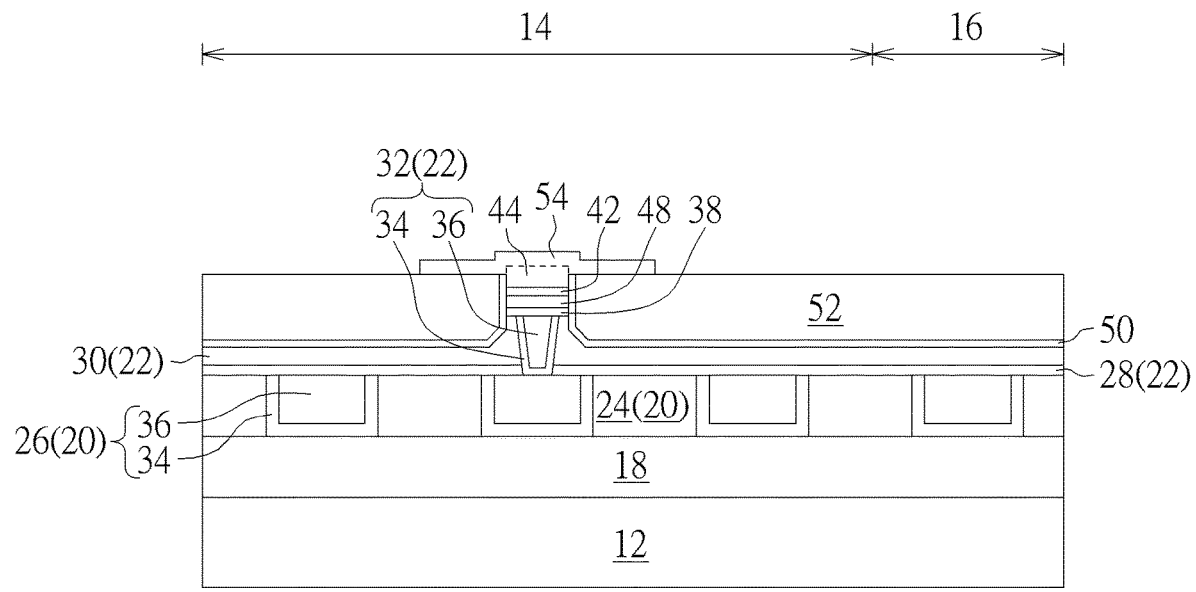

Next, as shown in FIG. 5, a pattern transfer or photo-etching process is conducted by using a patterned mask (not shown) as mask to remove part of the second SOT layer 54 on the passivation layer 52 as the remaining second SOT layer 54 is still disposed on the passivation layer 52 adjacent to two sides of first SOT layer 44.

Figure 6:
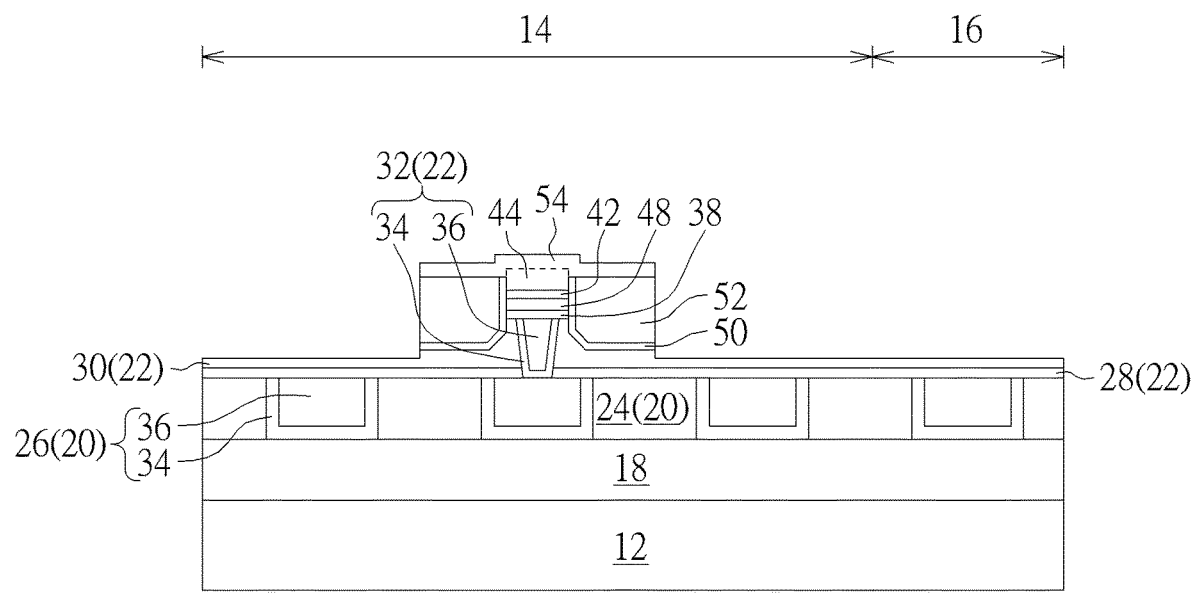

Next, as shown in FIG. 6, another pattern transfer or photo-etching process is conducted by using the remaining second SOT layer 54 as mask to remove part of the passivation layer 52, part of the cap layer 50, and part of the IMD layer 30 as the remaining IMD layer 30 still extends from the MRAM region 14 to the logic region 16.

Figure 7:
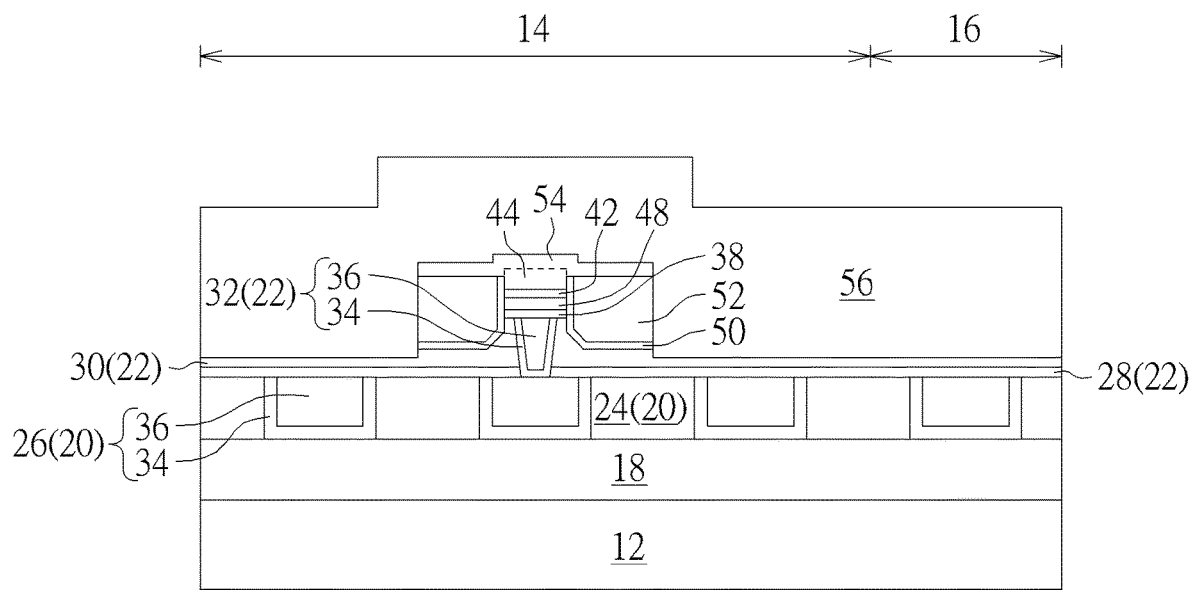

Next, as shown in FIG. 7, another IMD layer 56 is conformally formed on the second SOT layer 54 and the IMD layer 30. In this embodiment, the IMD layer 56 preferably include an ultra low-k (ULK) dielectric layer including but not limited to for example porous material or silicon oxycarbide (SiOC) or carbon doped silicon oxide (SiOCH).

Figure 8:
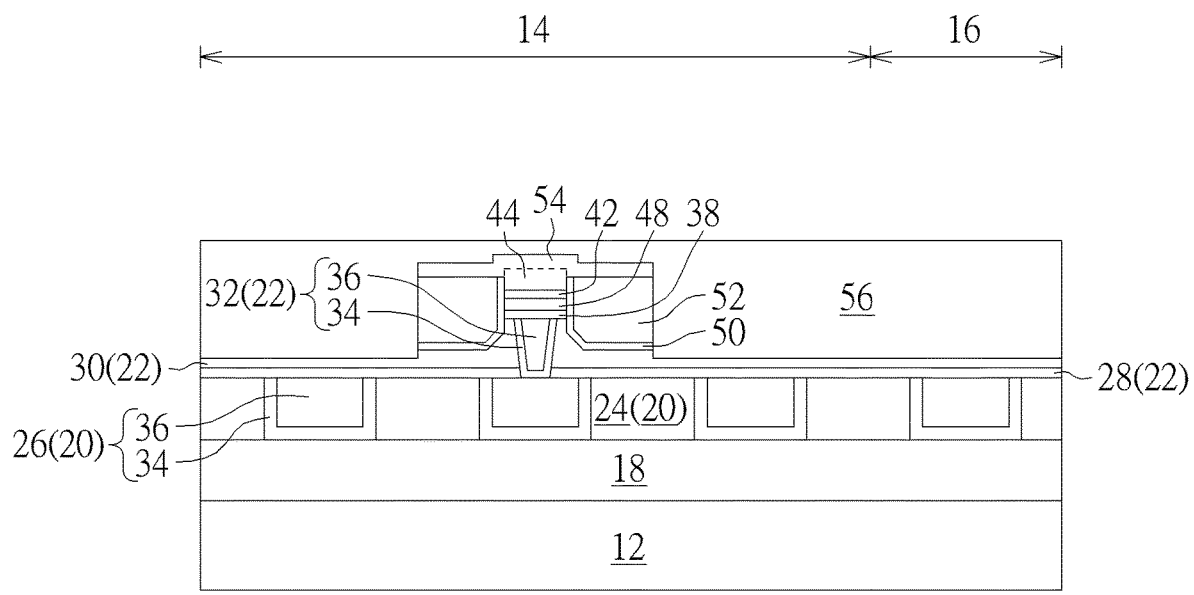

Next, as shown in FIG. 8, a planarizing process such as chemical mechanical polishing (CMP) process or etching back process is conducted to remove part of the IMD layer 56 while the top surface of the remaining IMD layer 56 is still higher than the top surface of the second SOT layer 54.

Figure 9:
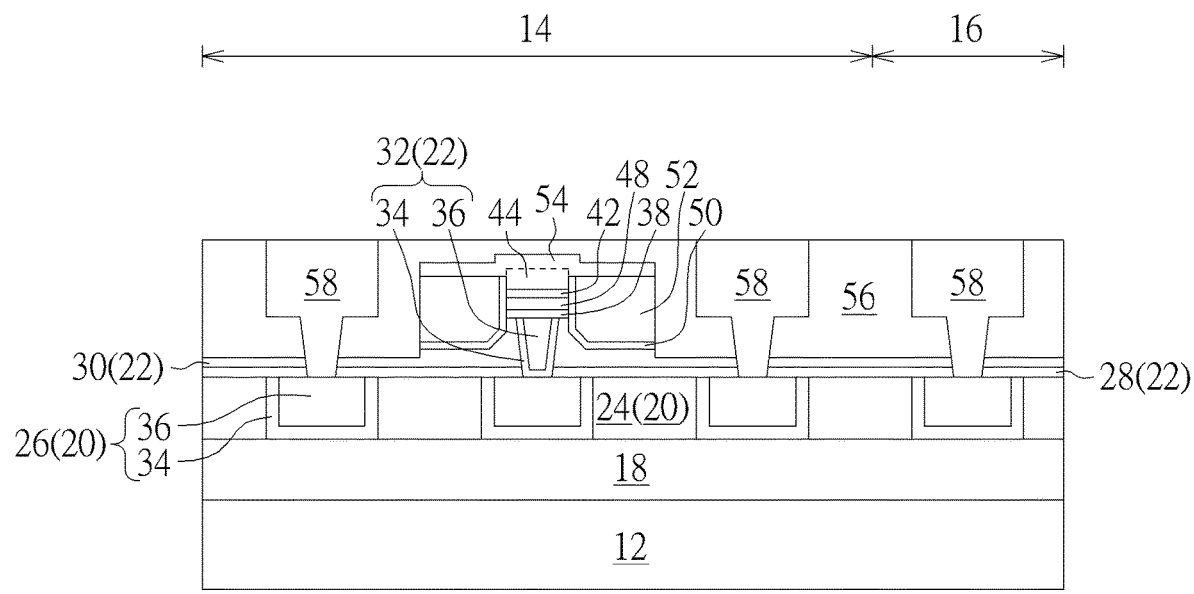

Next, as shown in FIG. 9, a pattern transfer process is conducted by using a patterned mask (not shown) to remove part of the IMD layer 56, part of the IMD layer 30, and part of the stop layer 28 on the MRAM region 14 and logic region 16 to form contact holes (not shown) exposing the metal interconnections 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the conductive materials including the aforementioned barrier layer and metal layer to form metal interconnections 58 in the contact holes electrically connecting the metal interconnections 26.

Figure 10:
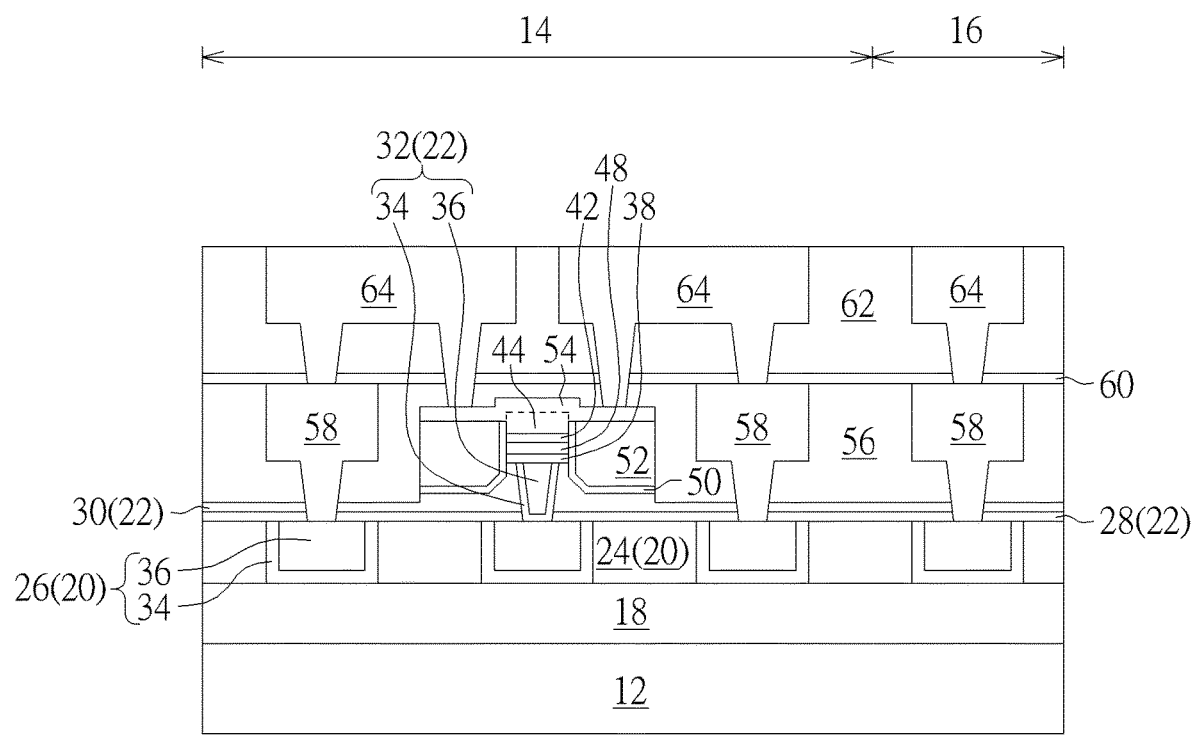

Next, as shown in FIG. 10, a stop layer 60 is formed on the MRAM region 14 and logic region 16 to cover the IMD layer 56 and metal interconnections 58, an IMD layer 62 is formed on the stop layer 60, and one or more photo-etching process is conducted to remove part of the IMD layer 62, part of the stop layer 60, and part of the IMD layer 56 on the MRAM region 14 and logic region 16 to form contact holes (not shown). Next, conductive materials are deposited into each of the contact holes and a planarizing process such as CMP is conducted to form metal interconnections 64 connecting the MTJ 48 and metal interconnections 58 underneath, in which the metal interconnections 64 on the MRAM region 14 directly contacts the second SOT layer 54 underneath while the metal interconnections 64 on the logic region 16 directly contacts the metal interconnections 58 on the lower level.

In this embodiment, the stop layers 60 and 28 could be made of same or different materials, in which the two layers 60, 28 could all include nitrogen doped carbide (NDC), silicon nitride, silicon carbon nitride (SiCN), or combination thereof. Similar to the metal interconnections formed previously, each of the metal interconnections 64 could be formed in the IMD layer 62 through a single damascene or dual damascene process. For instance, each of the metal interconnections 64 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Referring again to FIG. 10, FIG. 10 further illustrates a structural view of a semiconductor device according to an embodiment of the present invention. As shown in FIG. 10, the semiconductor device includes a MTJ 48 disposed on the substrate 12, a first SOT layer 44 disposed on the MTJ 48, a cap layer 50 disposed adjacent to the MTJ 48, a passivation layer 52 around the cap layer 50 and the MTJ 48, an IMD layer 56 around the passivation layer 52 and the cap layer 50, an IMD layer 62 disposed on the MTJ 48 and IMD layer 56, and metal interconnections 64 disposed in the IMD layer 62 and electrically connected to the MTJ 48.

Preferably, the top surfaces of the cap layer 50 and passivation layer 52 are coplanar and slightly lower than the top surface of the first SOT layer 44, sidewalls of the first SOT layer 44 are aligned with sidewalls of the bottom electrode 38, MTJ 48, and top electrode 42, sidewalls of the second SOT layer 54 are aligned with sidewalls of the passivation layer 52 and cap layer 50, and the top surface of the second SOT layer 54 directly on the passivation layer 52 is lower than the top surface of the second SOT layer 54 directly on the first SOT layer 44

It should also be noted that even though the top surface of the IMD layer 56 around the second SOT layer 54 is slightly higher than the topmost surface of the second SOT layer 54 in this embodiment, according to other embodiment of the present invention, it would also be desirable to conduct the aforementioned CMP process in FIG. 8 to remove the IMD layer 56 so that the top surface of the second SOT layer 54 is exposed or even the top surface of the IMD layer 56 is lower than the top surface of the second SOT layer 54. In other word, the top surface of the IMD layer 56 could be higher than the top surface of the second SOT layer 54 directly on top of the first SOT layer 44, even with the top surface of the second SOT layer 54 directly on top of the first SOT layer 44, or even with the top surface of the second SOT layer 54 directly on top of the passivation layer 54, which are all within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a magnetic tunneling junction (MTJ) on a substrate;
   a first spin orbit torque (SOT) layer on a top surface of the MTJ;
   a passivation layer around the MTJ; and
   a second SOT layer on the first SOT layer and the passivation layer.

2. The semiconductor device of claim 1, further comprising:
   a first inter-metal dielectric (IMD) layer on the substrate;
   a first metal interconnection in the first IMD layer;
   the MTJ on the first metal interconnection;
   a cap layer adjacent to the MTJ; and
   a second IMD layer around the passivation layer and the cap layer.

3. The semiconductor device of claim 2, wherein a top surface of the cap layer is lower than a top surface of the first SOT layer.

4. The semiconductor device of claim 2, wherein a sidewall of the second SOT layer is aligned with a sidewall of the cap layer.

5. The semiconductor device of claim 1, wherein a top surface of the passivation layer is lower than a top surface of the first SOT layer.

6. The semiconductor device of claim 1, wherein a sidewall of the first SOT layer is aligned with a sidewall of the MTJ.

7. The semiconductor device of claim 1, wherein a sidewall of the second SOT layer is aligned with a sidewall of the passivation layer.

8. The semiconductor device of claim 1, wherein a top surface of the second SOT layer on the passivation layer is lower than a top surface of the second SOT layer on the first SOT layer.

* * * * *